(12) United States Patent
Tayebati et al.

(10) Patent No.: US 9,972,975 B2
(45) Date of Patent: May 15, 2018

(54) HIGH-POWER LASER SYSTEMS WITH MODULAR DIODE SOURCES

(71) Applicants: Parviz Tayebati, Sherborn, MA (US); Bien Chann, Merrimack, NH (US); Bryan Lochman, Somerville, MA (US); Matthew Sauter, Boston, MA (US); Wang-Long Zhou, Andover, MA (US)

(72) Inventors: Parviz Tayebati, Sherborn, MA (US); Bien Chann, Merrimack, NH (US); Bryan Lochman, Somerville, MA (US); Matthew Sauter, Boston, MA (US); Wang-Long Zhou, Andover, MA (US)

(73) Assignee: TERADIODE, INC., Wilmington, MA (US)

( * ) Notice: Subject to any disclaimer, the term of this patent is extended or adjusted under 35 U.S.C. 154(b) by 0 days. days.

(21) Appl. No.: 15/660,134

(22) Filed: Jul. 26, 2017

(65) Prior Publication Data

US 2018/0041012 A1 Feb. 8, 2018

Related U.S. Application Data

(60) Provisional application No. 62/371,341, filed on Aug. 5, 2016.

(51) Int. Cl.
*H01S 5/40* (2006.01)
*H01S 5/024* (2006.01)
*H01S 5/022* (2006.01)

(52) U.S. Cl.
CPC ........ *H01S 5/4012* (2013.01); *H01S 5/02284* (2013.01); *H01S 5/02288* (2013.01); *H01S 5/02423* (2013.01); *H01S 5/4025* (2013.01)

(58) Field of Classification Search
CPC .............. H01S 5/4012; H01S 5/02284; H01S 5/02288; H01S 5/02423; H01S 5/4025
See application file for complete search history.

(56) References Cited

U.S. PATENT DOCUMENTS

| | | |
|---|---|---|
| 8,254,422 B2 | 8/2012 | Datta et al. |
| 2005/0169323 A1 | 8/2005 | Sparious et al. |
| 2011/0032604 A1 | 2/2011 | Rothenberg et al. |
| 2011/0216794 A1 | 9/2011 | Howard et al. |
| 2015/0177526 A1 | 6/2015 | Zhang et al. |

OTHER PUBLICATIONS

International Search Report, for International Application No. PCT/US2017/043906, dated Sep. 18, 2017, 9 pages.

*Primary Examiner* — Armando Rodriguez
(74) *Attorney, Agent, or Firm* — Morgan, Lewis & Bockius LLP

(57) ABSTRACT

In various embodiments, a modular laser system features an enclosure having interfaces for accepting input laser beam modules, optical elements for combining beams from the modules into a combined output beam, and a heat-exchange manifold for interfacing with and cooling the modules during operation.

20 Claims, 3 Drawing Sheets

HIGH-POWER LASER SYSTEMS WITH MODULAR DIODE SOURCES

RELATED APPLICATION

This application claims the benefit of and priority to U.S. Provisional Patent Application No. 62/371,341, filed Aug. 5, 2016, the entire disclosure of which is hereby incorporated herein by reference.

TECHNICAL FIELD

In various embodiments, the present invention relates to high-power laser systems having modular beam sources.

BACKGROUND

High-power laser systems are utilized for a host of different applications, such as welding, cutting, drilling, and materials processing. Such laser systems typically include a laser emitter, the laser light from which is coupled into an optical fiber (or simply a "fiber"), and an optical system that focuses the laser light from the fiber onto the workpiece to be processed. Wavelength beam combining (WBC) is a technique for scaling the output power and brightness from laser diodes, laser diode bars, stacks of diode bars, or other lasers arranged in a one- or two-dimensional array. WBC methods have been developed to combine beams along one or both dimensions of an array of emitters. Typical WBC systems include a plurality of emitters, such as one or more diode bars, that are combined using a dispersive element to form a multi-wavelength beam. Each emitter in the WBC system individually resonates, and is stabilized through wavelength-specific feedback from a common partially reflecting output coupler that is filtered by the dispersive element along a beam-combining dimension. Exemplary WBC systems are detailed in U.S. Pat. No. 6,192,062, filed on Feb. 4, 2000, U.S. Pat. No. 6,208,679, filed on Sep. 8, 1998, U.S. Pat. No. 8,670,180, filed on Aug. 25, 2011, and U.S. Pat. No. 8,559,107, filed on Mar. 7, 2011, the entire disclosure of each of which is incorporated by reference herein.

While techniques such as WBC have succeeded in producing laser-based systems for a wide variety of applications, wider adoption of such systems has resulted in the demand for ever-higher levels of laser output power. High-power laser systems such as WBC systems and/or fiber-coupled laser systems are quite complex and may therefore be quite expensive; therefore, reliability is a key metric for such systems. Many high-power laser systems utilize solid-state laser diode (or simply "diode") sources that are deeply integrated within the laser system; thus, reliability and cost of ownership of such systems is limited by the fact that the diode sources typically cannot be replaced in the field in the event of diode failure. Therefore, there is a need for high-power laser systems in which diode laser sources are more easily replaced or repaired, thereby improving system up-time and decreasing overall costs.

SUMMARY

In accordance with embodiments of the present invention, high-power laser systems feature multiple individually replaceable laser source modules each containing at least one laser source, e.g., one or more diode-based sources. The source modules may be removed from the system and replaced "in the field" by the end user, improving system reliability and operation time. In addition, the replaceable modules may be driven at higher currents, given their replaceability. Although in some embodiments such high current drive may result in earlier failure of individual diode sources, higher-current operation may enable systems in accordance with embodiments of the invention to utilize fewer sources (e.g., 20%-50% fewer sources), and may thus be correspondingly less expensive.

Laser source modules in accordance with embodiments of the invention may feature electrical and optical interfaces that interface with complementary features on a beam-combining enclosure in which the individual beams from the modules are combined into a single output beam (and, in some embodiments, coupled into an optical fiber). These optical and electrical interfaces facilitate the easy replacement of input laser sources with a minimal amount, if any, of associated alignment of the source. Systems in accordance with embodiments of the invention also feature modular heat-exchange manifolds that are easily connectable to and disconnectable from any desired number of laser sources utilized in the system. The source modules are insertable into and interface with input receptacles disposed in or on the enclosure in which the input beams are combined to form the output beam.

Laser devices in accordance with embodiments of the present invention may be utilized in WBC systems to form high brightness, low beam parameter product (BPP) laser systems. The BPP is the product of the laser beam's divergence angle (half-angle) and the radius of the beam at its narrowest point (i.e., the beam waist, the minimum spot size). The BPP quantifies the quality of the laser beam and how well it can be focused to a small spot, and is typically expressed in units of millimeter-milliradians (mm-mrad). A Gaussian beam has the lowest possible BPP, given by the wavelength of the laser light divided by pi. The ratio of the BPP of an actual beam to that of an ideal Gaussian beam at the same wavelength is denoted $M^2$, or the "beam quality factor," which is a wavelength-independent measure of beam quality, with the "best" quality corresponding to the "lowest" beam quality factor of 1.

As utilized herein, materials with a high thermal conductivity, or "thermally conductive materials," have a thermal conductivity of at least 100 watts per meter per Kelvin ($W \cdot m^{-1} \cdot K^{-1}$), at least 170 $W \cdot m^{-1} \cdot K^{-1}$, or even at least 300 $W \cdot m^{-1} \cdot K^{-1}$. As utilized herein, materials with a high electrical conductivity, or "electrically conductive materials," have an electrical conductivity, e.g., at 20° C., of at least $1 \times 10^5$ siemens per meter (S/m), at least $1 \times 10^6$ S/m, or even at least $1 \times 10^7$ S/m. As utilized herein, materials with a high electrical resistivity, or "electrically insulating materials," have an electrical resistivity of at least $1 \times 10^8$ ohm·meter ($\Omega \cdot m$), at least $1 \times 10^{10}$ $\Omega \cdot m$, or even at least $1 \times 10^{12}$ $\Omega \cdot m$.

As known to those of skill in the art, lasers are generally defined as devices that generate visible or invisible light through stimulated emission of light. Lasers generally have properties that make them useful in a variety of applications, as mentioned above. Common laser types include semiconductor lasers (e.g., laser diodes and diode bars), solid-state lasers, fiber lasers, and gas lasers. A laser diode is generally based on a simple diode structure that supports the emission of photons (light). However, to improve efficiency, power, beam quality, brightness, tunability, and the like, this simple structure is generally modified to provide a variety of many practical types of laser diodes. Laser diode types include small edge-emitting varieties that generate from a few milliwatts up to roughly half a watt of output power in a beam with high beam quality. Structural types of diode lasers include double hetero-structure lasers that feature a layer of low bandgap material sandwiched between two high bandgap layers; quantum well lasers that include a very thin middle (quantum well) layer resulting in high efficiency and quantization of the laser's energy; multiple quantum well lasers that include more than one quantum well layer to improve gain characteristics; quantum wire or quantum sea (dots) lasers that replace the middle layer with a wire or dots to produce higher-efficiency quantum well lasers; quantum cascade lasers that enable laser action at relatively long wavelengths that may be tuned by altering the thickness of the quantum layer; separate confinement heterostructure lasers, which are the most common commercial laser diode and include another two layers above and below the quantum well layer to efficiently confine the light produced; distributed feedback lasers, which are commonly used in demanding optical communication applications and include an integrated diffraction grating that facilitates generating a stable wavelength set during manufacturing by reflecting a single wavelength back to the gain region; vertical-cavity surface-emitting lasers (VCSELs), which have a different structure that other laser diodes in that light is emitted from its surface rather than from its edge; and vertical-external-cavity surface-emitting lasers (VECSELs) and external-cavity diode lasers, which are tunable lasers that use mainly double heterostructure diodes and include gratings or multiple-prism grating configurations. External-cavity diode lasers are often wavelength-tunable and exhibit a small emission line width. Laser diode types also include a variety of high power diode-based lasers including: broad area lasers that are characterized by multi-mode diodes with oblong output facets and generally have poor beam quality but generate a few watts of power; tapered lasers that are characterized by astigmatic mode diodes with tapered output facets that exhibit improved beam quality and brightness when compared to broad area lasers; ridge waveguide lasers that are characterized by elliptical mode diodes with oval output facets; and slab-coupled optical waveguide lasers (SCOWL) that are characterized by circular mode diodes with output facets and may generate watt-level output in a diffraction-limited beam with nearly a circular profile.

A diode-laser bar is a type of semiconductor laser containing a one-dimensional array of broad-area emitters or alternatively containing sub arrays containing, e.g., 10-20 narrow stripe emitters. A broad-area diode bar typically contains, for example, 19-49 emitters, each having dimensions on the order of, e.g., 1 μm×100 μm. The beam quality along the 1 μm dimension or fast-axis is typically diffraction-limited. The beam quality along the 100 μm dimension or slow-axis or array dimension is typically many times diffraction-limited. Typically, a diode bar for commercial applications has a laser resonator length of the order of 1 to 4 mm, is about 10 mm wide and generates tens of watts of output power. Most diode bars operate in the wavelength region from 780 to 1070 nm, with the wavelengths of 808 nm (for pumping neodymium lasers) and 940 nm (for pumping Yb:YAG) being most prominent. The wavelength range of 915-976 nm is used for pumping erbium-doped or ytterbium-doped high-power fiber lasers and amplifiers.

Embodiments of the present invention couple the one or more laser beams (e.g., emitted by laser devices packaged as detailed herein) into an optical fiber. In various embodiments, the optical fiber has multiple cladding layers surrounding a single core, multiple discrete core regions (or "cores") within a single cladding layer, or multiple cores surrounded by multiple cladding layers.

Herein, "optical elements" may refer to any of lenses, mirrors, prisms, gratings, and the like, which redirect, reflect, bend, or in any other manner optically manipulate electromagnetic radiation. Herein, beam emitters, emitters, or laser emitters, or lasers include any electromagnetic beam-generating device such as semiconductor elements, which generate an electromagnetic beam, but may or may not be self-resonating. These also include fiber lasers, disk lasers, non-solid state lasers, etc. Generally, each emitter includes a back reflective surface, at least one optical gain medium, and a front reflective surface. The optical gain medium increases the gain of electromagnetic radiation that is not limited to any particular portion of the electromagnetic spectrum, but that may be visible, infrared, and/or ultraviolet light. An emitter may include or consist essentially of multiple beam emitters such as a diode bar configured to emit multiple beams. The input beams received in the embodiments herein may be single-wavelength or multi-wavelength beams combined using various techniques known in the art. In addition, references to "lasers," "laser emitters," or "beam emitters" herein include not only single-diode lasers, but also diode bars, laser arrays, diode bar arrays, and single or arrays of vertical cavity surface-emitting lasers (VCSELs).

In an aspect, embodiments of the invention feature a laser system for combining a plurality of input beams into a combined output beam. The laser system includes, consists essentially of, or consists of an enclosure, a heat-exchange manifold, a plurality of input beam modules, a plurality of input receptacles disposed on the enclosure, and a plurality of optical elements disposed within the enclosure. The enclosure includes a beam output for outputting the combined output beam. The heat-exchange manifold includes, consists essentially of, or consists of (i) a reservoir for containing heat-exchange fluid, and (ii) a plurality of heat-exchange interfaces each including, consisting essentially of, or consisting of (a) an output conduit for supplying heat-exchange fluid and (b) an input conduit for receiving heat-exchange fluid. Each input module includes, consists essentially of, or consists of (i) a housing, (ii) a laser beam source disposed within the housing, (iii) disposed within the housing, a focusing optical element for receiving and focusing one or more input beams emitted by the laser beam source, (iv) disposed on the housing, an optical interface for transmitting the focused one or more input beams out of the housing, (v) disposed on the housing, an electrical interface for transmitting electrical power into the housing and to the laser beam source, and (vi) a cooling interface comprising (a) a cooling input for receiving heat-exchange fluid from one of the output conduits of the heat-exchange manifold and disposing the heat-exchange fluid in thermal contact with the laser beam source and (b) a cooling output for receiving heat-exchange fluid from the laser beam source after heat exchange therebetween and outputting the heat-exchange fluid to an input conduit of the heat-exchange manifold. Each input receptacle is configured to accept one of the input beam modules. Each input beam receptacle includes, consists essentially of, or consists of (i) an electrical output for supplying electrical power, (ii) an optical receiver for receiving one or more input beams from an input beam module, and (iii) an alignment feature for mechanically aligning an input beam module with the enclosure, whereby, when an input beam module is accepted within the input beam receptacle, the electrical output is electrically connected to the electrical interface of the input beam module and the optical receiver is optically aligned with the optical interface of the input beam module. The optical elements disposed within the enclosure receive input beams from the optical receivers of the input receptacles, combine the input beams into a combined output beam, and transmit the combined output beam to the beam output.

Embodiments of the invention may include one or more of the following in any of a variety of combinations. The beam output may include, consist essentially of, or consist of an output receptacle for receiving an optical fiber. An optical fiber may be coupled to the beam output. The beam output may include, consist essentially of, or consist of a window (e.g., an opening or a solid member substantially transparent to the output beam) for transmitting a free-space output beam. One or more, or even all, of the laser beam sources may include, consist essentially of, or consist of a diode bar configured to emit a plurality of laser beams. The plurality of optical elements disposed within the enclosure may include, consist essentially of, or consist of (i) focusing optics for focusing input beams onto a dispersive element, (ii) a dispersive element for receiving and dispersing the received focused input beams, and (iii) a partially reflective output coupler positioned to receive the dispersed beams, transmit a portion of the dispersed beams therethrough as the combined output beam, and reflect a second portion of the dispersed beams back toward the dispersive element. The plurality of optical elements disposed within the enclosure may include, consist essentially of, or consist of focusing optics for focusing input beams onto or proximate the beam output. The dispersive element may include, consist essentially of, or consist of a diffraction grating (e.g., a transmissive grating or a reflective grating). The optical elements may be configured to combine the input beams into the combined output beam and transmit the combined output beam to the beam output even if one or more of the input receptacles is empty. The laser system may include a control system configured to control flow of heat-exchange fluid through each of the heat-exchange interfaces. The control system may be configured to control the flow of heat-exchange fluid based at least in part on a sensed temperature of each of the input beam modules. The optical interface of at least one of the input beam modules may include, consist essentially of, or consist of a window, prism, and/or lens. The optical receiver of at least one of the input receptacles may include, consist essentially of, or consist of a window, prism, and/or lens.

In another aspect, embodiments of the invention feature a laser system for combining a plurality of input beams emitted by a plurality of input beam modules into a combined output beam. Each of the input beam modules includes, consists essentially of, or consists of (i) a housing, (ii) a laser beam source disposed within the housing, (iii) disposed within the housing, a focusing optical element for receiving and focusing one or more input beams emitted by the laser beam source, (iv) disposed on the housing, an optical interface for transmitting the focused one or more input beams out of the housing, (v) disposed on the housing, an electrical interface for transmitting electrical power into the housing and to the laser beam source, and (vi) a cooling interface comprising (a) a cooling input for receiving heat-exchange fluid and disposing the heat-exchange fluid in thermal contact with the laser beam source and (b) a cooling output for receiving heat-exchange fluid from the laser beam source after heat exchange therebetween and outputting the heat-exchange fluid. The laser system includes, consists essentially of, or consists of an enclosure, a heat-exchange manifold, a plurality of input receptacles disposed on the enclosure, and a plurality of optical elements disposed within the enclosure. The enclosure includes a beam output for outputting the combined output beam. The heat-exchange manifold includes, consists essentially of, or consists of (i) a reservoir for containing heat-exchange fluid, and (ii) a plurality of heat-exchange interfaces each including, consisting essentially of, or consisting of (a) an output conduit for supplying heat-exchange fluid to a cooling input of one of the input beam modules and (b) an input conduit for receiving heat-exchange fluid from a cooling output of one of the input beam modules. Each input receptacle is configured to accept one of the input beam modules. Each input receptacle includes, consists essentially of, or consists of (i) an electrical output for supplying electrical power, (ii) an optical receiver for receiving one or more input beams from an input beam module, and (iii) an alignment feature for mechanically aligning an input beam module with the enclosure, whereby, when an input beam module is accepted within the input beam receptacle, the electrical output is electrically connected to the electrical interface of the input beam module and the optical receiver is optically aligned with the optical interface of the input beam module. The plurality of optical elements receives input beams from the optical receivers of the input receptacles, combines the input beams into a combined output beam, and transmits the combined output beam to the beam output.

Embodiments of the invention may include one or more of the following in any of a variety of combinations. The beam output may include, consist essentially of, or consist of an output receptacle for receiving an optical fiber. An optical fiber may be coupled to the beam output. The beam output may include, consist essentially of, or consist of a window (e.g., an opening or a solid member substantially transparent to the output beam) for transmitting a free-space output beam. One or more, or even all, of the laser beam sources may include, consist essentially of, or consist of a diode bar configured to emit a plurality of laser beams. The plurality of optical elements disposed within the enclosure may include, consist essentially of, or consist of (i) focusing optics for focusing input beams onto a dispersive element, (ii) a dispersive element for receiving and dispersing the received focused input beams, and (iii) a partially reflective output coupler positioned to receive the dispersed beams, transmit a portion of the dispersed beams therethrough as the combined output beam, and reflect a second portion of the dispersed beams back toward the dispersive element. The plurality of optical elements disposed within the enclosure may include, consist essentially of, or consist of focusing optics for focusing input beams onto or proximate the beam output. The dispersive element may include, consist essentially of, or consist of a diffraction grating (e.g., a transmissive grating or a reflective grating). The optical elements may be configured to combine the input beams into the combined output beam and transmit the combined output beam to the beam output even if one or more of the input receptacles is empty. The laser system may include a control system configured to control flow of heat-exchange fluid through each of the heat-exchange interfaces. The control system may be configured to control the flow of heat-exchange fluid based at least in part on a sensed temperature of each of the input beam modules. The optical interface of at least one of the input beam modules may include, consist essentially of, or consist of a window, prism, and/or lens. The optical receiver of at least one of the input receptacles may include, consist essentially of, or consist of a window, prism, and/or lens.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the term "substantially" means ±10%, and in some embodiments, ±5%. The term "consists essentially of" means excluding other materials that contribute to function, unless otherwise defined herein. Nonetheless, such other materials may be present, collectively or individually, in trace amounts. Herein, the terms "radiation" and "light" are utilized interchangeably unless otherwise indicated. Herein, "downstream" or "optically downstream," is utilized to indicate the relative placement of a second element that a light beam strikes after encountering a first element, the first element being "upstream," or "optically upstream" of the second element. Herein, "optical distance" between two components is the distance between two components that is actually traveled by light beams; the optical distance may be, but is not necessarily, equal to the physical distance between two components due to, e.g., reflections from mirrors or other changes in propagation direction experienced by the light traveling from one of the components to the other.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1:
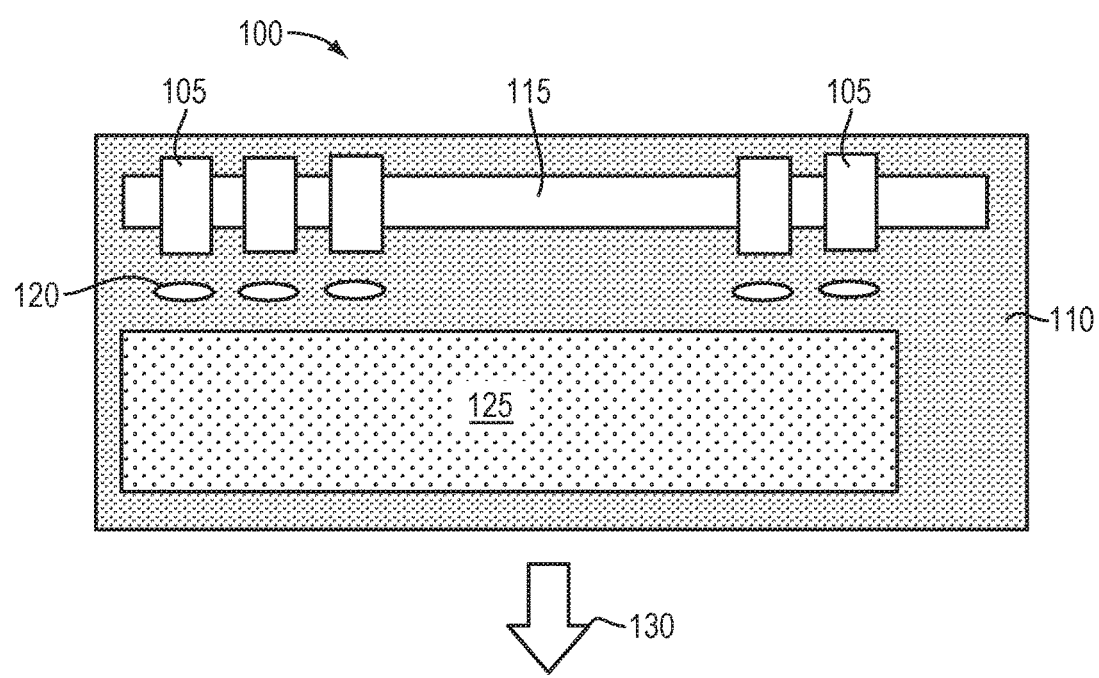
FIG. 1 is a schematic diagram of a conventional diode-based laser system.

FIG. 1 is a schematic diagram of a conventional diode-based laser system 100. As shown, multiple individual beam sources 105 are tightly integrated within a system enclosure 110 and with a cooling system 115 that flows coolant (e.g., water) through each beam source 105. The beam sources 105 are mounted within the enclosure 110 such that they are highly aligned with lenses 120 that focus the beams toward a beam combiner 125, which then outputs a combined output beam 130. As shown in FIG. 1, removal and replacement of any individual beam source 105 requires disruption of the cooling system 115 for all of the remaining sources 105, as well as time-consuming alignment between the replacement source 105 and the lenses 120 within the system enclosure 110.

Figure 2:
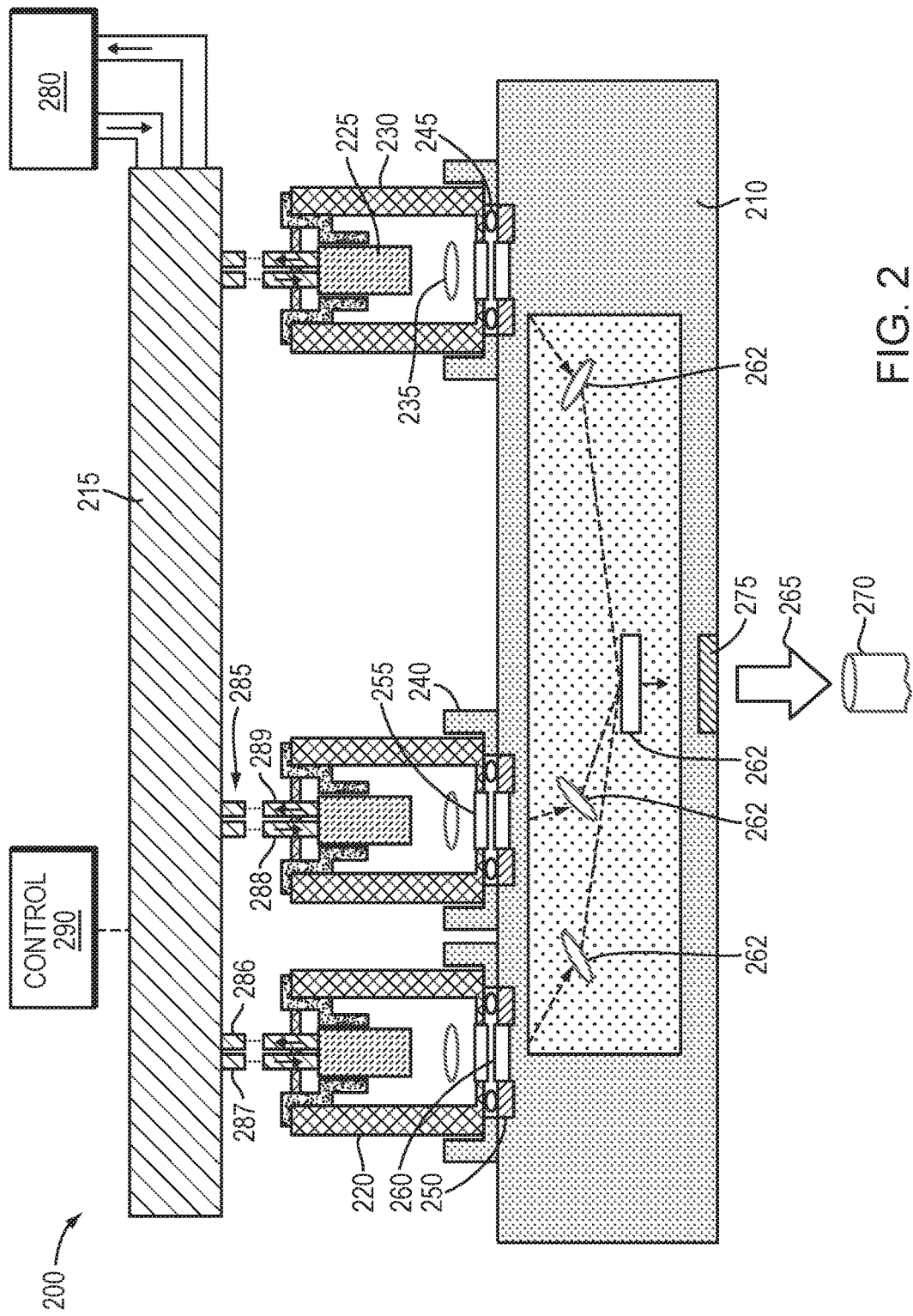
FIG. 2 is a schematic diagram of a high-power laser system having modular beam sources in accordance with embodiments of the present invention.

FIG. 2 is a schematic diagram of a high-power laser system 200 having modular beam sources in accordance with embodiments of the present invention. As shown, the laser system 200 features a beam-combining enclosure 210, a heat-exchange manifold 215, and multiple input beam modules 220. Each of the input beam modules 220 features a laser beam source 225 (e.g., a single beam source such as a laser diode, or a multiple-beam source such as a diode bar) disposed within a housing 230, as well as various structures facilitating interfacing with the beam-combining enclosure 210 and the heat-exchange manifold 215. In various embodiments of the invention, each input beam module 220 may include therewithin one or more focusing optics 235 (e.g., one or more optical elements such as cylindrical and/or spherical lenses) that receive and focus the beam(s) emitted by the laser diode source.

As shown, each input beam module 220 may connect mechanically, electrically, and optically with one of multiple input receptacles 240 disposed in or on (or forming portions of) the beam-combining enclosure 210. Electrical connections between the input beam modules 220 and the beam-combining enclosure 210 may be facilitated via an electrical interface 245 disposed on the input beam module housing 230 that electrically connects to a complementary electrical output within an input receptacle 250 on the beam-combining enclosure 210 when the beam module 220 is received therein. For example, the input beam module electrical interface 245 and the electrical output 250 may include, consist essentially of, or consist of wires, oppositely polarized (i.e., male and female) electrical connectors, bump bonds, or other electrically conductive structures. Each input beam module 220 may also include an optical interface 255 (e.g., one or more optical elements, lenses, prisms, and/or windows) through which the focused input beam is transmitted to the beam-combining enclosure 210. Mechanical alignment of the various input beam modules 220 to the input receptacles 240 of the beam-combining enclosure 210 may be facilitated by alignment features (e.g., sockets, protrusions, fasteners, clasps, etc.) shaped to receive and secure (e.g., latch or compressively retain) the input beam module 220 in an orientation in which optical and electrical interconnection of the input beam module 200 and beam-combining enclosure 210 result. Each input receptacle 240 may also include an optical receiver 260 (e.g., one or more optical elements, lenses, prisms, and/or windows) that receives the input beam from the input beam module 220 when the input beam module 220 is connected to the input receptacle 240. In various embodiments, the use of input receptacles obviates the need to utilize optical fiber or other separate connectors between the input beam modules 220 (and/or the beam sources therein) and the beam-combining enclosure 210.

In various embodiments, the beam-combining enclosure 210 also includes a gain medium for the formation and/or enhancement of optical gain for each of the beams emitted from the input beam modules 220. The gain medium may include, consist essentially of, or consist of one or more materials which, when excited by the beam(s) from input beam modules 220, undergoes stimulated emission. For example, the gain medium may include, consist essentially of, or consist of one or more crystals and/or glasses doped with one or more ions (e.g., rare-earth ions such as neodymium, ytterbium, or erbium or transition metal ions such as titanium or chromium), e.g., yttrium aluminum garnet ($Y_3Al_5O_{12}$), yttrium orthovanadate ($YVO_4$), sapphire ($Al_2O_3$), or cesium cadmium bromide ($CsCdBr_3$). Example gain media include Nd:YAG (neodymium-doped yttrium aluminum garnet), Yb:YAG (ytterbium-doped YAG), Yb:glass, Er:YAG (erbium-doped YAG), or Ti:sapphire used in the form of solid pieces or optical glass fibers.

In accordance with various embodiments, the beam-combining enclosure 210 contains one or more optical elements 262 that receive, from the optical receivers 260, the input beams emitted by the input beam modules 220 and combine the input beams into a combined (e.g., multi-wavelength) output beam 265. As shown, the output beam 265 may be coupled into an optical fiber 270. Once in-coupled into the optical fiber 270, the output beam 265 may be utilized to process (e.g., cut, weld, anneal, drill, etc.) a workpiece.

Importantly, in various embodiments the optical element(s) 262 within the beam-combining enclosure 210 combine the input beams of however many input beam modules 220 are present on the beam-combining enclosure 210, regardless of whether one or more of the input receptacles 240 is empty. For example, there may be an optical element 262 (e.g., one or more mirrors and/or lenses) associated with each of the input receptacles 240 and configured to direct an input beam therefrom to a common focal point (where another optical element 262 may be disposed) where all input beams are combined into a output beam 265. In various embodiments, controller 290 may shift and/or rotate one or more optical elements 262 associated with empty input receptacles 240 so that no stray light is directed thereby toward or into the combined output beam 265, via, e.g., one or more stepper motors, lead screws, and/or rotatable platforms associated with the optical elements 262. The controller 290 may detect whether or not an input receptacle 240 is empty or occupied via, e.g., a mechanical switch, an optical arrangement (e.g., including a light source directed across the input receptacle 240 and a photodetector that detects when the light beam from the light source is broken when an input beam module is present in the receptacle), or other detector triggered when a module 220 is inserted into or removed from an input receptacle 240.

The output beam may be emitted via a beam output element 275 (e.g., an optical element such as one or more lenses, and/or one or more windows) disposed in or on the beam-combining enclosure 210. In various embodiments, the beam output element 275 may include, consist essentially of, or consist of a window or opening for emitting a free-space output beam 265, or, e.g., a receptacle that connects to optical fiber 270, thereby producing a fiber-coupled output. The combined output beam may then be utilized for, e.g., materials processing such as cutting or welding.

Figure 3:
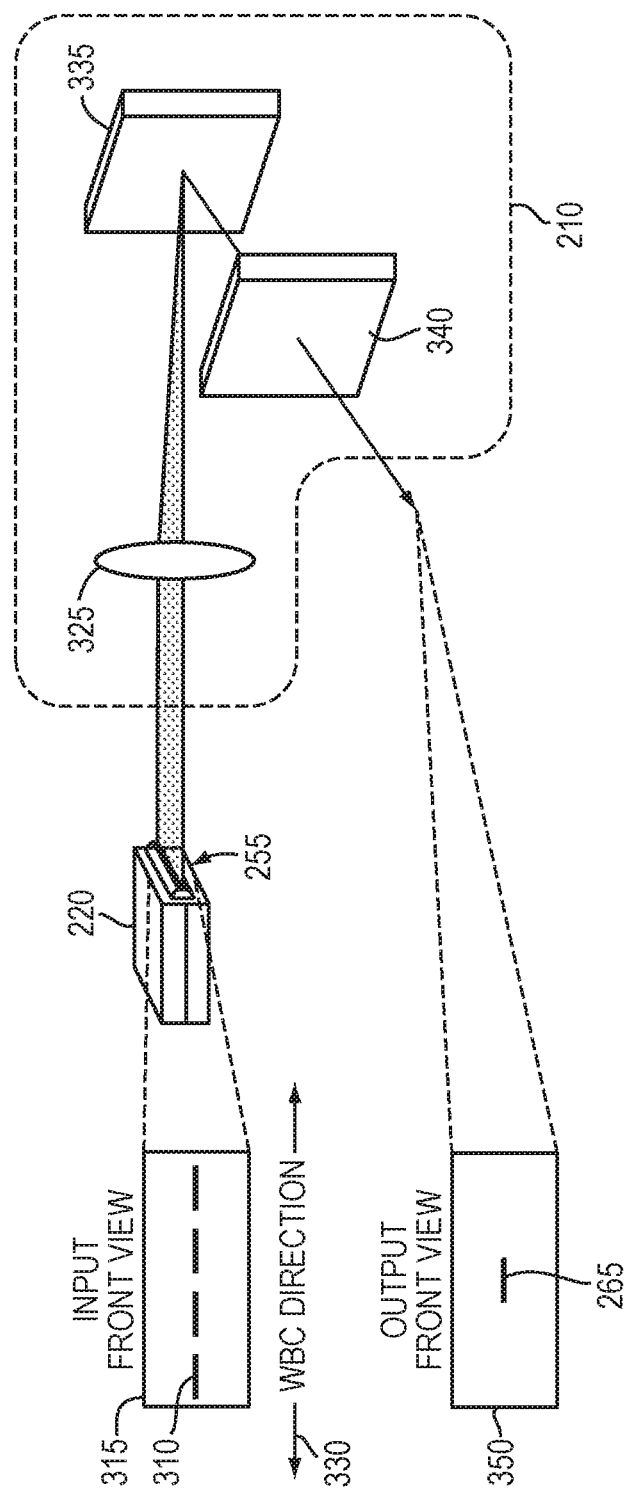
FIG. 3 is a partial schematic of elements of a beam-combining enclosure in accordance with embodiments of the present invention.

In various embodiments of the invention, the combining optical elements 262 within the beam-combining enclosure 210 may include, for example, various optical elements and lenses, a dispersion element (e.g., a diffraction grating) for dispersing the beams from the individual sources, and a partially reflective output coupler for receiving the dispersed beams and outputting the combined output (i.e., an output beam composed of the multiple wavelengths emitted by the individual diode sources). FIG. 3 depicts a partial schematic of various optical elements that may be present within the beam-combining enclosure 210. In the embodiment depicted in FIG. 3, an input beam module 220 features a diode bar having four beam emitters emitting beams 310 (see magnified input view 315), but embodiments of the invention may utilize individual diode or other laser sources, diode bars emitting any number of individual beams, and/or two-dimensional arrays or stacks of diodes or diode bars. In view 315, each beam 310 is indicated by a line, where the length or longer dimension of the line represents the slow diverging dimension of the beam, and the height or shorter dimension represents the fast diverging dimension. As discussed above, the input beam module may emit its beam(s) through optical interface 255. One or more optical elements 325 (e.g., transform optics), which may include, consist essentially of, or consist of one or more cylindrical or spherical lenses and/or mirrors, are used to combine each beam 310 along a WBC direction 330. Each optical element 325 may correspond to an optical receiver 260 and be associated with a single input beam module 220, and/or one or more optical elements 325 may receive the input beams from the optical receivers 260. The optical elements 325 then direct and/or overlap the combined beam onto a dispersive element 335 (which may include, consist essentially of, or consist of, e.g., a diffraction grating such as a reflective or transmissive diffraction grating), and the combined beam is then transmitted as single output profile onto an output coupler 340 (which may correspond to beam output element 275). The output coupler 340 then transmits the combined output beam 265 as shown on the output front view 350. The output coupler 340 is typically partially reflective and acts as a common front facet for all the laser elements in this external cavity system. An external cavity is a lasing system where the secondary mirror is displaced at a distance away from the emission aperture or facet of each laser emitter. In some embodiments, additional optics are placed between the emission aperture or facet and the output coupler or partially reflective surface. The output beam 265 may be coupled into optical fiber 270 and/or utilized for applications such as welding, cutting, annealing, etc. Although FIG. 3 depicts beam combining for only one input beam module 220 from which multiple beams are emitted, one or more of the optical elements within the beam-combining enclosure 210 (e.g., optical element 325 and/or dispersive element 335) may receive one or more beams from one or more additional input beam modules 220 so that such beams are also combined into output beam 265. In addition, FIG. 3 depicts an embodiment in which the input beams from the various input beam modules 220 are combined via WBC into a common multi-wavelength output beam 265; in other embodiments, the beams from the input beam modules 220 are simply spatially overlapped into output beam 265 without the use of WBC.

In various embodiments of the invention, the heat-exchange manifold 215 circulates cooling fluid to the input beam modules 220 to prevent the input beam modules 220 from heating to excessive or damaging temperatures during operation. The heat-exchange manifold 215 may include, or may be in fluid connection with, a reservoir 280 of cooling fluid. The reservoir 280 and/or the heat-exchange manifold 215 may incorporate or be in thermal contact with, for example, one or more heat exchangers for cooling the cooling fluid prior to the cooling fluid being supplied to the input beam modules 220 and after heated fluid is received from the input beam modules 220. As shown, the heat-exchange manifold 215 also includes multiple heat-exchange interfaces 285 each connected to one of the input beam modules 220. Each of the heat-exchange interfaces 285 may include, consist essentially of, or consist of, e.g., an input conduit 286 for receiving "spent" or heated fluid from the input beam module 220 and an output conduit 287 for supplying cool fluid to the input beam module 220. The input and output conduits 286, 287 may interface with cooling inputs 288 and outputs 289 (e.g., openings and/or conduits) disposed on each of the input beam modules 220, thereby forming a recirculation loop for the cooling fluid that extends from the heat-exchange manifold 215, to each of the input beam modules 220, and back to the heat-exchange manifold 215 (and/or to the reservoir 280 and/or to one or more heat exchangers). In various embodiments of the invention, the input 288 and output 289 on one or more of the input beam modules fluidly connect to a heat-management package (e.g., anode and/or cathode coolers) for the beam source 225 as described in U.S. patent application Ser. No. 15/627,917, filed on Jun. 20, 2017, the entire disclosure of which is incorporated by reference herein.

Exemplary cooling fluids that may be utilized in accordance with embodiments of the present invention include water, glycols, or other heat-exchange fluids. The degree of cooling provided by the heat-exchange manifold 215 may be based on the number of installed input beam modules 220, or may depend on monitored temperature (e.g., of one or more installed input beam modules 220) in a feedback configuration. For example, each of the input beam modules 220 and/or input receptacles 240 may incorporate therewithin a temperature sensor (e.g., a thermistor, thermometer, thermocouple, etc.), and a controller (or "control system") 290 (which is operatively coupled to all or a portion of heat-exchange manifold 215 and/or to one or more other components of system 200) may control the flow of cooling fluid through the heat-exchange manifold 215 based at least in part on the sensed temperature. For example, the controller 290 may control one or more valves, which may each be associated with one or more of the heat-exchange interfaces 285, to open or close based on the sensed temperature of one or more of the input beam modules 220 and/or the beam sources therewithin. The controller 290 may also control one or more pumps and/or valves that determine the flow rate of heating fluid through the heat-exchange manifold 215 and/or the temperature of cooling fluid in reservoir 280 based at least in part on the sensed temperature(s).

The controller 290 may be provided as either software, hardware, or some combination thereof. For example, the system may be implemented on one or more conventional server-class computers, such as a PC having a CPU board containing one or more processors such as the Pentium or Celeron family of processors manufactured by Intel Corporation of Santa Clara, Calif., the 680x0 and POWER PC family of processors manufactured by Motorola Corporation of Schaumburg, Ill., and/or the ATHLON line of processors manufactured by Advanced Micro Devices, Inc., of Sunnyvale, Calif. The processor may also include a main memory unit for storing programs and/or data relating to the methods described above. The memory may include random access memory (RAM), read only memory (ROM), and/or FLASH memory residing on commonly available hardware such as one or more application specific integrated circuits (ASIC), field programmable gate arrays (FPGA), electrically erasable programmable read-only memories (EEPROM), programmable read-only memories (PROM), programmable logic devices (PLD), or read-only memory devices (ROM). In some embodiments, the programs may be provided using external RAM and/or ROM such as optical disks, magnetic disks, as well as other commonly used storage devices. For embodiments in which the functions are provided as one or more software programs, the programs may be written in any of a number of high level languages such as FORTRAN, PASCAL, JAVA, C, C++, C#, BASIC, various scripting languages, and/or HTML. Additionally, the software may be implemented in an assembly language directed to the microprocessor resident on a target computer; for example, the software may be implemented in Intel 80x86 assembly language if it is configured to run on an IBM PC or PC clone. The software may be embodied on an article of manufacture including, but not limited to, a floppy disk, a jump drive, a hard disk, an optical disk, a magnetic tape, a PROM, an EPROM, EEPROM, field-programmable gate array, or CD-ROM.

In the event of failure of or damage to one of the laser sources 225 or input beam modules 220, the operator of the laser system 200 may simply unplug the affected input beam module 220 from the beam-combining enclosure 210 and disconnect the input beam module 220 from the heat-exchange manifold 215, and replace the faulty input beam module 220 with a replacement input beam module 220. The presence of a malfunctioning input beam module 220 (and/or the absence of one or more input beam modules 220 from various input receptacles 240) does not affect overall operation of the beam-combining enclosure 210 beyond reducing overall output power. The various interfaces and connection features of the beam-combining module 210, the heat-exchange manifold 215, and the input beam modules 220 facilitates rapid replacement of the input beam modules 220 during deployment of the laser system 200 by the end user. Thus, laser systems in accordance with embodiments of the present invention are more reliable and less expensive to maintain than conventional high-power laser systems. Moreover, since only the input beam modules 220 require replacement in the event of failure of one or more of the input beam sources 225, the remaining components of the laser system 200 need not be moved or shipped to a supplier for repair in the event of a failure.

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A laser system for combining a plurality of input beams into a combined output beam, the laser system comprising:
    an enclosure comprising a beam output for outputting the combined output beam;
    a heat-exchange manifold comprising (i) a reservoir for containing heat-exchange fluid, and (ii) a plurality of heat-exchange interfaces each comprising (a) an output conduit for supplying heat-exchange fluid and (b) an input conduit for receiving heat-exchange fluid;
    a plurality of input beam modules, each input beam module comprising (i) a housing, (ii) a laser beam source disposed within the housing, (iii) disposed within the housing, a focusing optical element for receiving and focusing one or more input beams emitted by the laser beam source, (iv) disposed on the housing, an optical interface for transmitting the focused one or more input beams out of the housing, (v) disposed on the housing, an electrical interface for transmitting electrical power into the housing and to the laser beam source, and (vi) a cooling interface comprising (a) a cooling input for receiving heat-exchange fluid from one of the output conduits of the heat-exchange manifold and disposing the heat-exchange fluid in thermal contact with the laser beam source and (b) a cooling output for receiving heat-exchange fluid from the laser beam source after heat exchange therebetween and outputting the heat-exchange fluid to an input conduit of the heat-exchange manifold;
    disposed on the enclosure, a plurality of input receptacles, each input receptacle configured to accept one of the input beam modules, wherein each input receptacle comprises (i) an electrical output for supplying electrical power, (ii) an optical receiver for receiving one or more input beams from an input beam module, and (iii) an alignment feature for mechanically aligning an input beam module with the enclosure, whereby, when an input beam module is accepted within the input beam receptacle, the electrical output is electrically connected to the electrical interface of the input beam module and the optical receiver is optically aligned with the optical interface of the input beam module; and disposed within the enclosure, a plurality of optical elements for receiving input beams from the optical receivers of the input receptacles, combining the input beams into a combined output beam, and transmitting the combined output beam to the beam output.

2. The system of claim 1, wherein the beam output comprises an output receptacle for receiving an optical fiber.

3. The system of claim 1, wherein the beam output comprises a window for transmitting a free-space output beam.

4. The system of claim 1, wherein one or more of the laser beam sources comprises a diode bar configured to emit a plurality of laser beams.

5. The system of claim 1, wherein the plurality of optical elements disposed within the enclosure comprises (i) focusing optics for focusing input beams onto a dispersive element, (ii) a dispersive element for receiving and dispersing the received focused input beams, and (iii) a partially reflective output coupler positioned to receive the dispersed beams, transmit a portion of the dispersed beams therethrough as the combined output beam, and reflect a second portion of the dispersed beams back toward the dispersive element.

6. The system of claim 5, wherein the dispersive element comprises a diffraction grating.

7. The system of claim 1, wherein the optical elements are configured to combine the input beams into the combined output beam and transmit the combined output beam to the beam output even if one or more of the input receptacles is empty.

8. The system of claim 1, further comprising a control system configured to control flow of heat-exchange fluid through each of the heat-exchange interfaces.

9. The system of claim 8, wherein the control system is configured to control the flow of heat-exchange fluid based at least in part on a sensed temperature of each of the input beam modules.

10. The system of claim 1, wherein the optical interface of at least one of the input beam modules comprises at least one of a window, prism, or lens.

11. The system of claim 1, wherein the optical receiver of at least one of the input receptacles comprises at least one of a window, prism, or lens.

12. A laser system for combining a plurality of input beams emitted by a plurality of input beam modules into a combined output beam, wherein each of the input beam modules comprises (i) a housing, (ii) a laser beam source disposed within the housing, (iii) disposed within the housing, a focusing optical element for receiving and focusing one or more input beams emitted by the laser beam source, (iv) disposed on the housing, an optical interface for transmitting the focused one or more input beams out of the housing, (v) disposed on the housing, an electrical interface for transmitting electrical power into the housing and to the laser beam source, and (vi) a cooling interface comprising (a) a cooling input for receiving heat-exchange fluid and disposing the heat-exchange fluid in thermal contact with the laser beam source and (b) a cooling output for receiving heat-exchange fluid from the laser beam source after heat exchange therebetween and outputting the heat-exchange fluid, the laser system comprising:

an enclosure comprising a beam output for outputting the combined output beam;

a heat-exchange manifold comprising (i) a reservoir for containing heat-exchange fluid, and (ii) a plurality of heat-exchange interfaces each comprising (a) an output conduit for supplying heat-exchange fluid to a cooling input of one of the input beam modules and (b) an input conduit for receiving heat-exchange fluid from a cooling output of one of the input beam modules;

disposed on the enclosure, a plurality of input receptacles, each input receptacle configured to accept one of the input beam modules, wherein each input receptacle comprises (i) an electrical output for supplying electrical power, (ii) an optical receiver for receiving one or more input beams from an input beam module, and (iii) an alignment feature for mechanically aligning an input beam module with the enclosure, whereby, when an input beam module is accepted within the input beam receptacle, the electrical output is electrically connected to the electrical interface of the input beam module and the optical receiver is optically aligned with the optical interface of the input beam module; and disposed within the enclosure, a plurality of optical elements for receiving input beams from the optical receivers of the input receptacles, combining the input beams into a combined output beam, and transmitting the combined output beam to the beam output.

13. The system of claim 12, wherein the beam output comprises an output receptacle for receiving an optical fiber.

14. The system of claim 12, wherein the beam output comprises a window for transmitting a free-space output beam.

15. The system of claim 12, wherein the plurality of optical elements disposed within the enclosure comprises (i) focusing optics for focusing input beams onto a dispersive element, (ii) a dispersive element for receiving and dispersing the received focused input beams, and (iii) a partially reflective output coupler positioned to receive the dispersed beams, transmit a portion of the dispersed beams therethrough as the combined output beam, and reflect a second portion of the dispersed beams back toward the dispersive element.

16. The system of claim 15, wherein the dispersive element comprises a diffraction grating.

17. The system of claim 12, wherein the optical elements are configured to combine the input beams into the combined output beam and transmit the combined output beam to the beam output even if one or more of the input receptacles is empty.

18. The system of claim 12, further comprising a control system configured to control flow of heat-exchange fluid through each of the heat-exchange interfaces.

19. The system of claim 18, wherein the control system is configured to control the flow of heat-exchange fluid based at least in part on a sensed temperature of each of the input beam modules.

20. The system of claim 12, wherein the optical receiver of at least one of the input receptacles comprises at least one of a window, prism, or lens.

* * * * *